United States Patent [19]

Sano et al.

[11] Patent Number: 5,707,900
[45] Date of Patent: Jan. 13, 1998

[54] METHOD OF HEAT-TREATING SEMICONDUCTOR CRYSTAL OF A GROUP II-GROUP VI COMPOUND

[75] Inventors: Michihiro Sano, Odawara; Keizo Kawaguchi, Yokohama, both of Japan

[73] Assignee: Stanley Electric Co., Ltd., Tokyo, Japan

[21] Appl. No.: 743,408

[22] Filed: Nov. 1, 1996

[30] Foreign Application Priority Data

Nov. 17, 1995 [JP] Japan ................... 7-322470

[51] Int. Cl.[6] .................... H01L 21/20; H01L 21/36
[52] U.S. Cl. .................... 438/509; 438/795; 438/796; 438/103
[58] Field of Search .................... 437/81, 82, 104, 437/105, 106, 127, 131, 247, 248

[56] References Cited

U.S. PATENT DOCUMENTS

| | | | |
|---|---|---|---|
| 4,685,979 | 8/1987 | Nishizawa | 437/81 |
| 4,735,910 | 4/1988 | Mitsuyu et al. | 437/105 |
| 4,965,244 | 10/1990 | Horikawa et al. | 437/81 |
| 5,354,708 | 10/1994 | Taskar et al. | 437/106 |
| 5,433,170 | 7/1995 | Toda et al. | 437/105 |
| 5,492,080 | 2/1996 | Ohkawa et al. | 437/105 |

*Primary Examiner*—Tuan H. Nguyen
*Attorney, Agent, or Firm*—Frishauf, Holtz, Goodman, Langer & Chick, P.C.

[57] ABSTRACT

Known MBE methods of heat-treating semiconductor crystal of a group II-group VI compound for crystal growth are accompanied by a problem of releasing the component elements during the heat-treatment to produce a coarse crystal surface that adversely affects the subsequent crystal growth steps. According to the invention, this problem is eliminated by irradiating a substrate of a group II-group VI compound, specifically ZnSe, with Zn beams and Se beams depending on the vapor pressures of the elements between the respective starting points and the respective terminating points to compensate the released Zn and Se so that consequently no oxide film is formed on the ZnSe substrate when the heat-treatment is completed to produce a plane crystal surface that is free from coarseness.

4 Claims, 1 Drawing Sheet

METHOD OF HEAT-TREATING SEMICONDUCTOR CRYSTAL OF A GROUP II-GROUP VI COMPOUND

BACKGROUND OF THE INVENTION

1. Field of the Invention

This invention relates to a method of heat-treating semiconductor crystal of a group II-group VI compound that can be used for light emitting devices (LEDs) and optical lenses and, more particularly, it relates to a method of heat-treating semiconductor crystal of a group II-group VI compound for crystal growth.

2. Background Art

With a known method of growing semiconductor crystal of a group II-group VI compound, a substrate made of semiconductor crystal of a group II-group VI compound is placed in a substrate heating device arranged in a molecular beam epitaxial apparatus (hereinafter referred to as MBE apparatus) and the apparatus is firstly evacuated to produce an ultravacuum state there.

Then, the substrate is heat-treated according to the temperature profile T1 as illustrated in FIG. 3 of the accompanying drawings, while maintaining the ultravacuum state. Referring to FIG. 3, the temperature in the apparatus is raised from room temperature RT to heat-treatment temperature HT (e.g., 450° C.), which is maintained for a heat-treatment period N (e.g., 10 minutes), and then gradually lowered to growth temperature ET.

However, the above described known heat-treatment method cannot prevent a component elements from being released from the crystal because semiconductor crystal of a group II-group VI compound contains an element having a high vapor pressure so that, when the heat-treatment is over, the crystal shows a coarse surface, which by turn adversely affect the subsequent growth steps.

SUMMARY OF THE INVENTION

According to the invention, the above identified problem of known heat-treatment methods is resolved by providing a method of heat-treating a substrate of semiconductor crystal of a group II-group VI compound for growing the semiconductor crystal of the group II-group VI compound by molecular beam epitaxial (MBE) method characterized in that it comprises steps of starting an irradiation of molecular beams of the component element having a higher vapor pressure when the evaporation initiating temperature of the element is reached and starting an irradiation of molecular beams of the component element having a lower vapor pressure when the evaporation initiating temperature of the element is reached in the heating phase of raising the temperature from room temperature to heat-treatment temperature, and terminating the irradiation of molecular beams of the component element having a lower vapor pressure when the evaporation initiating temperature of the element is reached and terminating the irradiation of molecular beams of the component element having a higher vapor pressure when the evaporation initiating temperature of the element is reached in the cooling phase of lowering the temperature from heat-treatment temperature to growth temperature after the completion of the heat-treatment. Thereby used component elements can be prevented from being released from the crystal.

DETAILED DESCRIPTION OF THE PREFERRED EMBODIMENTS

Now, the present invention will be described by referring to the accompanying drawings that illustrate a preferred embodiment of the invention. This embodiment will be described in terms of semiconductor crystal of a group II-group VI compound comprising Zn, a group II element, and Se, a group VI element.

For growing a substrate of semiconductor crystal of a group II-group VI compound, which is ZnSe, by MBE method, firstly the ZnSe substrate is cleansed in an appropriate etching process and then placed on a substrate heating device in an MBE growth chamber, which is then evacuated to produce a ultravacuum state there.

Figure 1:
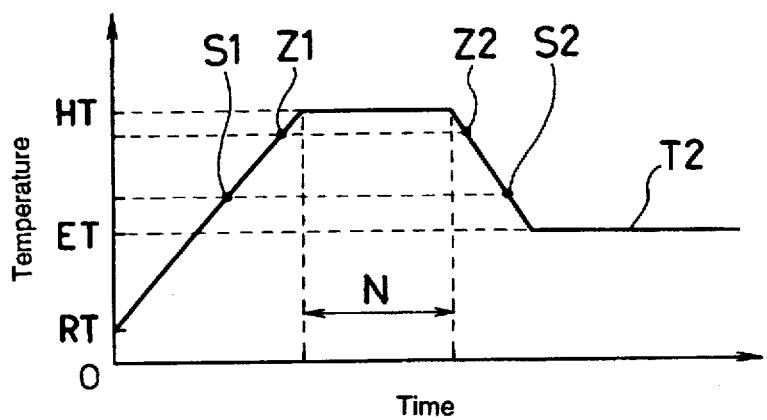
FIG. 1 is a graph of the temperature profile of the present invention.

After the completion of the evacuating operation, the substrate is heated by means of the substrate heating device according to the temperature profile T2 of FIG. 1, while maintaining the ultravacuum state in the chamber. In the course of raising the temperature of the ZnSe substrate from room temperature RT to heat-treatment temperature HT, an irradiation of beams of Se, which is the element having a higher vapor pressure of the two, onto the ZnSe substrate is started at initiating time S1, when the temperature of the ZnSe substrate reaches 250° to 300° C.

Thereafter, an irradiation of beams of Zn, which is the element having a lower vapor pressure, onto the ZnSe substrate is started at initiating time Z1, when the temperature of the ZnSe substrate gets to 350° to 390° C. Since the irradiation of Se beams is going on at this time, both Se beams and Zn beams are irradiated onto the ZnSe substrate from time Z1.

The temperature of the ZnSe substrate rises under this condition and, when the temperature gets to heat-treatment temperature HT, which is typically 450° C. (although the optimum heat-treatment temperature may vary depending on the quality of the ZnSe substrate), the temperature of the ZnSe substrate is maintained at this level for heat-treatment time N, which may be 10 minutes for instance.

After the completion of the heat-treatment, the temperature of the ZnSe substrate is lowered to growth temperature ET. In the course of lowering the temperature, the irradiation of beams of Zn, which is the element having a lower vapor pressure, is terminated at terminating time Z2 when the temperature of the ZnSe substrate falls to the level at which the irradiation of beams of Zn was started, which is 350° to 390° C.

Thereafter, the irradiation of beams of Se, which is the element having a higher vapor pressure, is terminated at terminating time S2, when the temperature of the ZnSe substrate falls to the level at which the irradiation of beams of Se was started, which is 250° to 300° C. Then, the temperature of the ZnSe substrate is lowered further until it gets to growth temperature ET.

Figure 2:
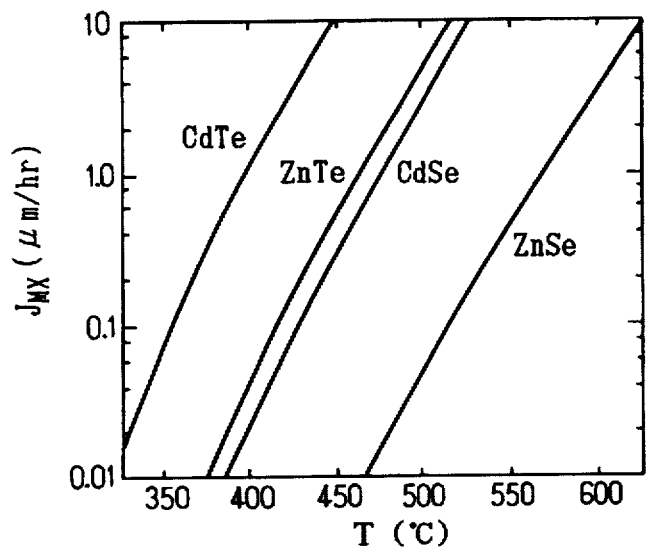
FIG. 2 is a graph showing the re-evaporation speed of some semiconductor crystals of group II-group VI compounds.
Figure 3:
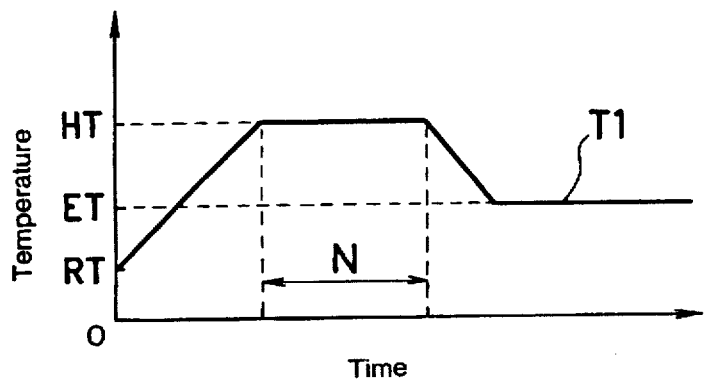
FIG. 3 is a graph of the temperature profile of a known heat-treatment method.

Note that the irradiation of Zn beams and that of Se beams are respectively controlled to such rates that they do not grow the ZnSe substrate at and near the heat-treatment temperature HT. This can be done by appropriately selecting the respective products of the adhesion coefficients of Zn and Se multiplied by the rates of Zn and Se beam irradiation, or the growth rate of the substrate, in such a way that it does not exceed the re-evaporation rate of the ZnSe substrate at and near the heat-treatment temperature HT (e.g., 450° C.) in FIG. 2.

If, for example, the heat-treatment temperature is 450° C. and both Zn and Se beams are irradiated at a rate of 1.0 (Å/sec), the growth rate does not exceed the re-evaporation rate and no growth of the ZnSe substrate will be observed because the adhesion coefficients of Zn and Se are rather low at and near that temperature.

Besides ZnSe, semiconductor crystals of group II–group VI compounds include CdSe, ZnTe and CdTe and the present invention is applicable to them.

With semiconductor crystal of any group II–group VI compound, irradiations of molecular beams of the component elements are initiated at appropriate respective temperatures selected according to the respective vapor pressures of the elements. The rates of molecular beam irradiations of the respective elements may well be selected by taking into consideration the re-evaporation rate of the substrate at and near the heat-treatment temperature.

With a method of heat-treating semiconductor crystal of a Group II–Group VI compound, since irradiations of molecular beams of the component elements, or Zn beams and Se beams, are conducted while the substrate of the semiconductor crystal is being heated, the Zn and Se being released from the ZnSe substrate due to heat are compensated by the beams so that no oxide film is formed on the substrate at the time of completion of the heat-treatment and therefore a plane crystal surface having no coarseness is produced to improve the yield of manufacturing semiconductor crystal products such as LEDs in the subsequent steps.

Since the irradiations of molecular beams of the component elements are confined to temperature ranges above the evaporation initiating temperatures of the respective elements, any unintended Growth of the crystal due to irradiation of beams of the elements that are not coming out of the crystal is effectively prevented to further improve the effect of producing a plane crystal surface.

As described above in detail, there is provided a method of heat-treating a substrate of semiconductor crystal of a Group II–Group VI compound comprising irradiations of molecular beams of the component elements at respective temperatures at or above the evaporation initiating temperatures of the elements so that the element that is more apt to be released from the crystal and the element that is less apt to be released from of the crystal due to the difference of the vapor pressures during the heat-treatment are compensated by the irradiations of the respective elements to consequently prevent any coarse surface of the crystal from appearing to consequently give rise to a plan surface after the heat-treatment and improve the yield of manufacturing semiconductor crystal products in the subsequent steps.

What is claimed is:

1. A method of heat-treating a substrate of semiconductor crystal of a group II–group VI compound for growing the semiconductor crystal of the group II–group VI compound by molecular beam epitaxial (MBE) method characterized in that it comprises steps of starting an irradiation of molecular beams of the component element having a higher vapor pressure when the evaporation initiating temperature of the element is reached and starting an irradiation of molecular beams of the component element having a lower vapor pressure when the evaporation initiating temperature of the element is reached in the heating phase of raising the temperature from room temperature to heat-treatment temperature, and terminating the irradiation of molecular beams of the component element having a lower vapor pressure when the evaporation initiating temperature of the element is reached and terminating the irradiation of molecular beams of the component element having a higher vapor pressure when the evaporation initiating temperature of the element is reached in the cooling phase of lowering the temperature from heat-treatment temperature to growth temperature after the completion of the heat-treatment.

2. A method of heat-treating a substrate of semiconductor crystal of a group II–group VI compound according to claim 1, wherein said semiconductor crystal of a group II–group VI compound is ZnSe.

3. A method of heat-treating a substrate of semiconductor crystal of a group II - group VI compound according to claim 2, wherein said heat-treatment temperature is not lower than 400° C.

4. A method of heat-treating a substrate of semiconductor crystal of a group II–group VI compound according to claim 1, wherein said heat-treatment temperature is not lower than 400° C.

* * * * *